(12) United States Patent
Tanaka et al.

(10) Patent No.: US 7,692,296 B2
(45) Date of Patent: Apr. 6, 2010

(54) SEMICONDUCTOR DEVICE AND MULTILAYER SUBSTRATE THEREFOR

(75) Inventors: Naotaka Tanaka, Chiyoda (JP); Kenya Kawano, Chiyoda (JP); Akira Nagai, Tsukuba (JP); Koji Tasaki, Tsukuba (JP); Masaaki Yasuda, Tsukuba (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

(21) Appl. No.: 11/085,520

(22) Filed: Mar. 22, 2005

(65) Prior Publication Data
US 2005/0230826 A1    Oct. 20, 2005

(30) Foreign Application Priority Data
Mar. 22, 2004    (JP)    ............... 2004-082704

(51) Int. Cl.
H01L 23/48    (2006.01)
H01L 23/52    (2006.01)
H01L 29/40    (2006.01)

(52) U.S. Cl. .................................................... 257/737

(58) Field of Classification Search ............... 257/688, 257/736–739, 759, 772, 779, E23.015, E23.023–E23.079, 257/678–733, 787–796, E23.001–E23.019, 257/738, E23.021; 438/15, 26, 51, 55, 64, 438/106, 124–127, 83, 98, 100, 101, 111, 438/112, 123, 411, 412, 461, 584, 597–688

See application file for complete search history.

(56) References Cited

U.S. PATENT DOCUMENTS 5,919,329 A * 7/1999 Banks et al. ............. 156/281
6,184,577 B1 * 2/2001 Takemura et al. ........... 257/737
6,747,356 B2 * 6/2004 Ando et al. ................ 257/758
7,042,083 B2 * 5/2006 Sugizaki et al. ............. 257/701
2002/0041027 A1 * 4/2002 Sugizaki .................... 257/737
2002/0072145 A1 * 6/2002 Tanaka et al. .............. 438/106
2002/0127839 A1 * 9/2002 Umetsu et al. ............. 438/618

FOREIGN PATENT DOCUMENTS

JP    9-199468    7/1997
JP    10-245615    9/1998

OTHER PUBLICATIONS www.efunda.com (May 23, 2008, eFunda).*

(Continued)

*Primary Examiner*—Dao H Nguyen
*Assistant Examiner*—Tram H Nguyen
(74) *Attorney, Agent, or Firm*—Antonelli, Terry, Stout & Kraus, LLP.

(57) ABSTRACT

A semiconductor device is provided with connection reliability between a bump electrode and a substrate electrode. An elastic modulus of an adhesive material used to electrically connect a metal bump and an interconnect pattern, and sealing the circuit surface of an LSI chip, after thermosetting is $E_a$; an elastic modulus of an insulating material of a packaging substrate surface layer after thermosetting is $E_b$; an elastic modulus of a core material, if used, is $E_c$, and the following rational expression is satisfied at normal temperature or a thermal contact bonding temperature of the adhesive material: at least $E_a < E_b < E_c$, preferably $\frac{1}{3} E_b < E_a < E_b < 3 E_a (< E_c)$. With this arrangement, a stable connection state can be attained irrespective of the level of the contact bonding load or fluctuations of it upon mass production and, therefore, high yield can be attained at low cost.

13 Claims, 8 Drawing Sheets

OTHER PUBLICATIONS www.astm.org/Standards/D638.htm (May 23, 2008, ASTM).*
Zebarjad et al., "Role of the interface on the deformation mechanism of glass fiber/polypropylene composites", Journal of Materials Science Letters vol. 21, No. 13, p. 1007-11 (Jul. 1, 2002).*
West, "why plastic don't live up to design data", Product Engineering, p. 80-82, vol. 37, No. 9, (Apr. 25, 1966).*
www.efunda.com.*
Annual Book of ASTM Standard.*

* cited by examiner

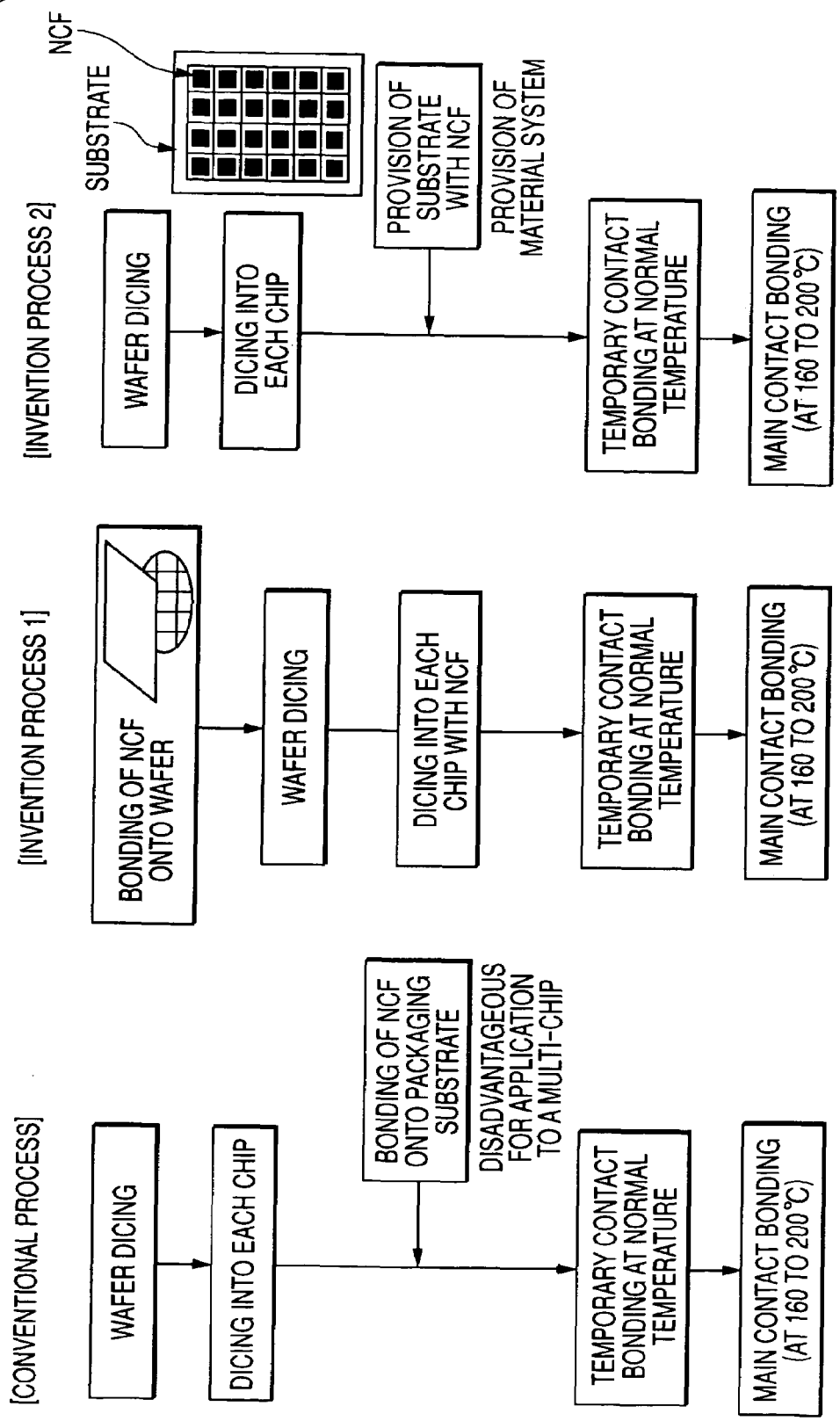

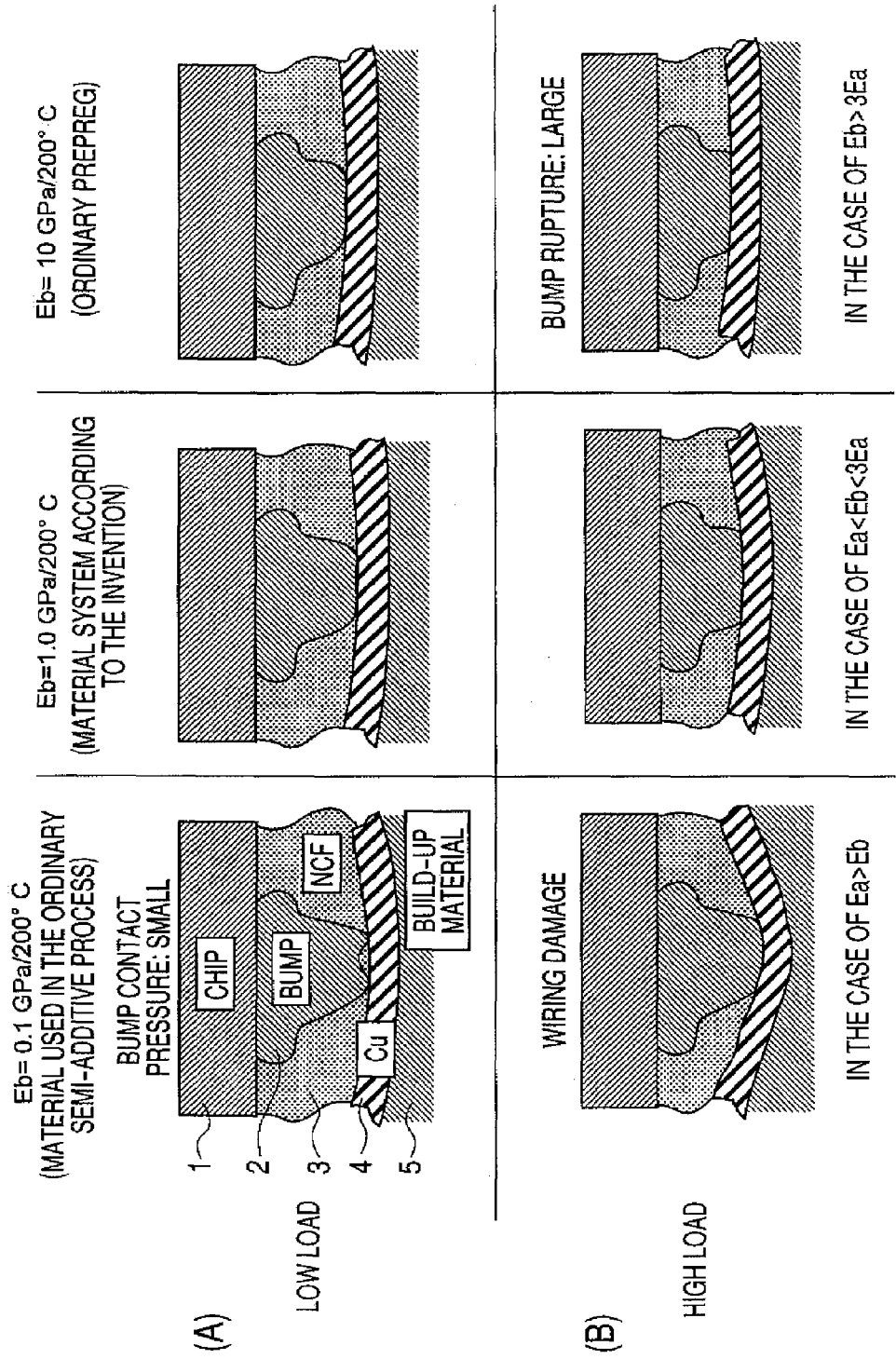

MEASUREMENT RESULTS OF CONNECTION RESISTANCE
IN TEMPERATURE CYCLE TEST

SEMICONDUCTOR DEVICE AND MULTILAYER SUBSTRATE THEREFOR

CLAIM OF PRIORITY

The present application claims priority from Japanese application serial JP2004-082704 filed on Mar. 22, 2004, the content of which is hereby incorporated by reference into this application.

FIELD OF THE INVENTION

The present invention relates to a semiconductor device, particularly to a technology for securing the connection between a microelectrode over a semiconductor element and a substrate.

BACKGROUND OF THE INVENTION

In the semiconductor packaging fields, what is attracting attention as a connection form capable of meeting an increase in the pins of the device or high density packaging is not the conventional loop connection via wire bonding but is flip chip packaging technology which connects a semiconductor element directly to an electrode over a wiring substrate via a bump electrode formed on the electrode portion of a semiconductor chip.

When wire bonding is adopted, it is necessary to keep a connection area for electrode pad around the semiconductor chip mounted on a semiconductor device. With an increase in the number of pins, the area inevitably becomes larger.

According to the flip chip packaging technology, on the other hand, the connection can be completed within the area of a chip to be mounted. This makes it possible not only to decrease the packaging area but also to shorten the connection wiring length.

Moreover, since the circuit surface comes on the mounting side of the substrate, another semiconductor chip having at least an equal size can be stacked thereover. This technology can therefore be applied advantageously to a three-dimensional packaging structure which has attracted recent attentions.

As the flip chip packaging system, a system of having a solder bump at a chip electrode portion and achieving electrical conduction by solder connection has been popular. In order to satisfy the recent pin-pitch decreasing tendency, however, a system of disposing a gold bump on a chip electrode portion and achieving electrical conduction by gold bump connection has come to be employed frequently.

There are two connection methods using a gold bump. One is a so-called metallurgical bonding method such as gold/gold metal bonding or gold/solder connection obtained by applying a solder paste between a gold bump/substrate electrode. The other one is a non-metallurgical bonding method in which electrical conduction is achieved by the contact between a gold bump and a substrate electrode.

The metallurgical bonding method is generally excellent from the viewpoint of reliability at the bonded portion, but has a demerit, because it has a solder bonding step which needs high-temperature treatment.

The non-metallurgical bonding system is, on the other hand, presumed to be effective for actualizing future narrow-pitch connection, because the electrical conduction can be attained not only at low temperature but also in a convenient manner and at a low cost.

The non-metallurgical bonding system has thus the above-described advantages. On the other hand, it involves the demerit that since it adopts contact conduction, connection reliability is not stable if design or material selection is not proper. At present, therefore, this system has not yet been applied to products generally.

There is a description on the improvement in connection reliability in the non-metallurgical bonding system, for example, in the inventions disclosed in Patent Document 1 and Patent Document 2. In these Patent Documents 1 and 2, disclosed is a connection structure in which an elastic modulus of an insulating surface layer of a substrate has been adjusted appropriately in order to obtain a uniform contact state between a bump electrode disposed on a semiconductor chip and an electrode formed on a packaging substrate.

[Patent Document 1] Japanese Patent Laid-Open No. H9(1997)-199468

[Patent Document 2] Japanese Patent Laid-Open No. H10 (1998)-245615

There is a demand for a further decrease in the pitch between electrodes in order to meet the request for imparting semiconductor devices with more functions and for decreasing the size of them.

In order to narrow the pitch between electrodes in the non-metallurgical bonding system, a problem how to stabilize the contact state between a bump electrode and a substrate electrode must be resolved.

As the miniaturization of bump electrodes proceeds in future with the pitch narrowing tendency, when an adhesive material (non-conductive or anisotropic conductive resin) for sealing the surroundings of a bump has a large linear expansion coefficient, for example, plastic deformation of a bump electrode is accelerated upon thermal contact bonding by the thermal shrinkage of the adhesive material, leading to an inconvenience such as easy separation of the contact surface or disconnection upon re-heating.

On the contrary, when the linear expansion coefficient of the adhesive material is small, a certain contact pressure cannot be obtained stably when the surface layer of the packaging substrate has low rigidity (elastic modulus). This also leads to an inconvenience such as easy separation of the contact surface or disconnection.

Only by adjusting the rigidity (elastic modulus) of an insulating material constituting the surface layer of the packaging substrate as in the technology described in the above-described Patent Documents 1 and 2, it is difficult to keep high reliability of the non-metallurgical flip chip connection corresponding to narrow pitch connection.

Moreover, misalignment of a bump electrode and a substrate electrode upon mounting, which has not been taken up seriously as a problem in the background art, will become a problem under pitch narrowing tendency in future. When the pitch becomes narrower, a 10 to 15 μm misalignment of the mounting position of a bump relative to a substrate electrode will decrease a contact conduction region by almost half. This tendency becomes conspicuous as the pitch becomes narrower.

When an actual mass production process of a semiconductor device is taken into consideration, it is essential to avoid an influence of misalignment of the bump electrode on the connection yield (fabrication yield) even if existence of such a level of misalignment is permitted.

For actualizing the connection of electrodes with a narrow pitch, miniaturization of interconnect patterns around a substrate electrode is inevitable so that the wiring strength of a substrate reduces radically owing to the generation of a thermal stress.

Accordingly, when the reliability of the whole package structure in a semiconductor device is considered, it is essential to actualize a substrate constitution capable of ensuring not only connection reliability of the contact conduction portion of a bump electrode but also connection reliability of minute interconnects over the substrate.

SUMMARY OF THE INVENTION

An object of the present invention is to actualize a semiconductor device having improved connection reliability between a bump electrode and a substrate electrode; and a multilayer substrate for the semiconductor device.

The present invention has the following constitution in order to attain the above-described objects.

(1) A semiconductor device according to the present invention comprises a semiconductor element having a metal bump electrode formed thereover; a multilayer substrate having an interconnect layer placed at a position corresponding to the disposal position of the bump electrode of the semiconductor element and a plurality of insulating material layers; and a thermosetting adhesive material sandwiched between the semiconductor element and the multilayer substrate for connecting the multilayer substrate with the semiconductor element while bringing the interconnect layer of the multilayer substrate into contact with the metal bump.

In the semiconductor device according to the present invention, supposing that an elastic modulus of the thermosetting adhesive material after thermosetting is Ea, and an elastic modulus of the insulating material layer on the semiconductor element side of the multilayer substrate after thermosetting is Eb, their relationship satisfies the following rational expression at normal temperature or at a thermal contact bonding temperature of the metal bump and the interconnect layer: $\frac{1}{3}Eb < Ea < Eb < 3Ea$.

(2) In the above-described invention (1), supposing that an elastic modulus of the core material layer opposite to the semiconductor element via the insulating material layer on the side of the semiconductor element is Ec, the relationship between Ea and Ec preferably satisfies the following rational expression at normal temperature or at a thermal contact bonding temperature of the metal bump electrode and the interconnect layer: $3Ea < Ec$.

(3) In a semiconductor device according to the present invention, supposing that a linear expansion coefficient of the thermosetting adhesive material after thermosetting is aa and a linear expansion coefficient of the insulating material layer on the semiconductor element side of the multilayer substrate after thermosetting is ab, their relationship satisfies the following rational expression at normal temperature or at a thermal contact bonding temperature of the metal bump and the interconnect layer: $1 < 3aa < ab < aa < 3ab$.

(4) In the above-described invention (3), supposing that a linear expansion coefficient of the core material layer opposite to the semiconductor element via the insulating material layer on the semiconductor element side is ac, the relationship between ac and aa satisfies the following rational expression at normal temperature or at a thermal contact bonding temperature of the metal bump electrode and the interconnect layer: $ac < \frac{1}{3}aa$.

(5) In a semiconductor device according to the present invention, supposing that an elastic modulus of the thermosetting adhesive material after thermosetting is Ea, an elastic modulus of the insulating material layer on the semiconductor element side of the multilayer substrate is Eb, and an elastic modulus of the core material layer opposite to the semiconductor element via the insulating material layer on the side of the semiconductor element is Ec, the relationship among them satisfies the following rational expression at normal temperature or at a thermal contact bonding temperature of the metal bump and the interconnect layer: $Ea < Eb < Ec$.

(6) In a semiconductor device according to the present invention, supposing that a linear expansion coefficient of the thermosetting adhesive material after thermosetting is aa, a linear expansion coefficient of the insulating material layer on the semiconductor element side of the multilayer substrate after thermosetting is ab, and a linear expansion coefficient of the core material layer opposite to the semiconductor element via the insulating material layer on the semiconductor element side is ac, the relationship among them satisfies the following rational expression at normal temperature or at a thermal contact bonding temperature of the metal bump electrode and the interconnect layer: $ac < ab < aa$.

(7) In the above-described invention (1), (2) or (5), the elastic moduli Ea, Eb and Ec are each preferably based on a storage elastic modulus as measured by the viscoelasticity measuring method or a surface layer elastic modulus determined by the indentation test using a nanoindenter.

(8) In the above-described invention (3), (4) or (6), the linear expansion coefficients aa, ab and ac are each preferably based on a linear expansion coefficient as measured by the thermal expansion measuring method.

(9) In the above-described inventions from (1) to (7), the thermal contact bonding temperature of the semiconductor element preferably falls within a range of from 160° C. to 200° C.

(10) In the above-described inventions from (1) to (7), the adhesive material and insulating material layer each preferably contains a filler.

(11) In the above-described inventions from (1) to (7), the adhesive material preferably contains conductive particles.

(12) A multilayer substrate for a semiconductor device according to the present invention comprises an interconnect layer disposed at a position corresponding to the position of a bump electrode of a semiconductor element, a plurality of insulating material layers, and a thermosetting adhesive material placed over the insulating material layer disposed on the semiconductor element side in order to connect the multilayer substrate to the semiconductor element, while bringing the interconnect layer into contact with the metal bump of the semiconductor element.

In the above-described multilayer substrate for a semiconductor device, supposing that an elastic modulus of the thermosetting adhesive material after thermosetting is Ea and an elastic modulus of the insulating material layer on the semiconductor element side after thermosetting is Eb, their relationship satisfies the following rational expression at normal temperature or at a thermal contact bonding temperature of the metal bump and the interconnect layer: $\frac{1}{3}Eb < Ea < Eb < 3Ea$.

(13) In the above-described invention (12), supposing that an elastic modulus of the core material layer opposite to the semiconductor element via the insulating material layer on the semiconductor element side is Ec, the relationship between Ea and Ec satisfies the following rational expression at normal temperature or at a thermal contact bonding temperature of the metal bump electrode and the interconnect layer: $3Ea < Ec$.

According to the present invention, a semiconductor device and a multilayer substrate therefore, each having improved connection reliability between a bump electrode and a substrate electrode can be actualized.

This makes it possible to accomplish an increase in the fabrication yield of a semiconductor device and at the same time, reliability improvement in an acceleration test such as a temperature cycle test compared with the background art.

Moreover, according to the present invention, a stable connection state can be maintained even if a misalignment occurs between a bump and a pad which is expected to occur with an electrode pitch decreasing tendency in future.

Although interconnects of a substrate becomes finer with a pitch decreasing tendency, the present invention makes it possible to drastically reduce the load on the interconnects, thereby improving the reliability of the whole module structure including the substrate.

BRIEF DESCRIPTION OF THE DRAWINGS

FIG. 4 illustrates the manufacturing process of a semiconductor device according to the present invention;

FIG. 5 illustrates the influential mechanism, on the bump connection state, of an elastic modulus of an insulating material constituting the surface layer of a substrate;

DETAILED DESCRIPTION OF THE PREFERRED EMBODIMENTS

The embodiments of the present invention will be described more specifically referring to accompanying drawings.

Figure 1:
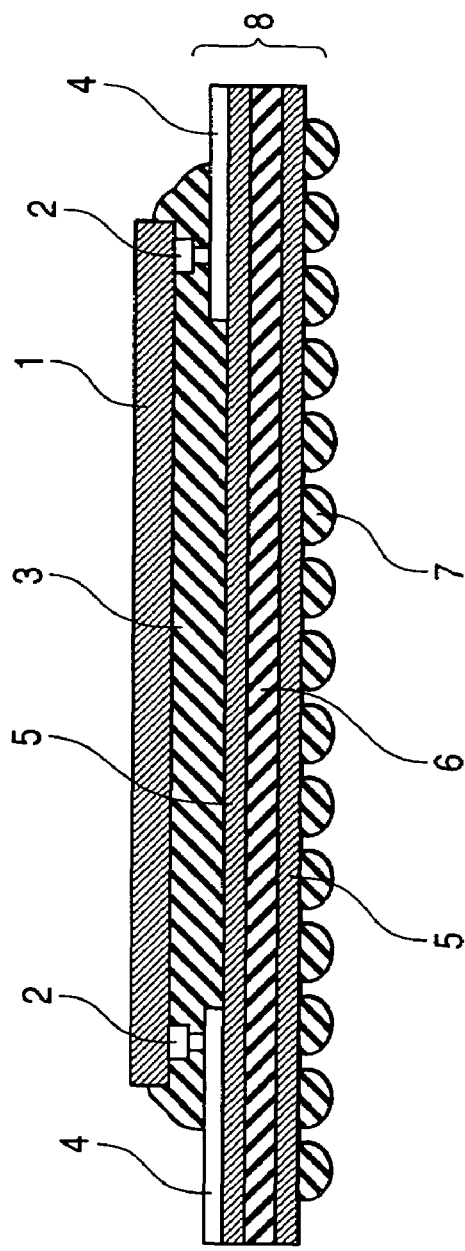
FIG. 1 is a schematic cross-sectional view of a semiconductor device according to a first embodiment of the present invention.

FIG. 1 is a schematic cross-sectional view of a semiconductor device according to a first embodiment of the present invention.

In FIG. 1, a metal bump 2 is formed on an electrode pad of an LSI chip 1. Although the material of the metal bump 2 is not limited, it is fundamentally made of a gold alloy and is formed as a stud bump by a wire bonding process or a solder bump by a plating process.

Over a packaging substrate 8 on which the LSI chip 1 is mounted, an interconnect pattern (having a gold-plated surface) 4 to be placed at a position corresponding to the metal bump 2 formed over the LSI chip 1 is formed. This interconnect pattern 4 constitutes an interconnect layer. The LSI chip 1 is contact-bonded onto the packaging substrate 8 via an adhesive member 3 after alignment between the metal bump 2 and interconnect pattern 4, whereby mutual electrical connection (basically, contact conduction between the metal bump 2 and interconnect pattern 4 by contact pressure) and sealing of the LSI circuit surface are conducted simultaneously.

The adhesive material 3 usable here is a non-conductive adhesive sheet (NCF: non conductive film), a liquid paste (NCP: non conductive paste) or an anisotropic conductive sheet having conductive particles mixed therein (ACF: anisotropic conductive film), each usually having a thermosetting epoxy resin as a base.

The packaging substrate 8 is equipped with a core material 6 and an insulating material layer 5 which is usually called "a build-up layer". These layers are electrically connected via a Cu interconnect and Cu via. For interconnect formation, the semi additive method is commonly employed for forming interconnects with a narrow pitch. In this process, however, when the insulating material has high rigidity, surface roughening is insufficient, which sometimes lowers adhesiveness of Cu plating. In this case, a method of mechanically roughening the surface on the side of a Cu foil and then, bonding this side to the insulating material is proposed. According to this method, no problem occurs in the adhesion of Cu plating even if the rigidity of the insulating material is high.

On the reverse side (the lower side of FIG. 1) of the packaging substrate 8, land interconnects are formed for mounting solder balls. Solder bumps 7 are formed by transferring solder balls, which have a proper size for the mounting pitch of the solder bumps, to the respective land surfaces via flux, and then performing a solder reflow step. The solder bumps 7 are not always necessary and a semiconductor device can be formed without solder bumps 7.

Supposing that an elastic modulus of the adhesive material 3 used for the purpose of electrical connection between the metal bump 2 and interconnect pattern 4 and sealing of the LSI circuit surface of the LSI chip 1 after thermosetting is Ea, an elastic modulus of the insulating material 5 on the surface layer of the packaging substrate 8 after thermosetting is Eb, and an elastic modulus of a core material 6 in the case where the substrate is a multilayer substrate having a core layer is Ec, a material system in the first embodiment of the present invention satisfies the relationship represented by the following rational expression (1) at normal temperature or a thermal contact bonding temperature of the adhesive material 3.

At least $Ea<Eb<Ec$, preferably $\frac{1}{3}Eb<Ea<Eb<3Ea$ $(<Ec)$     (1)

Alternatively, supposing that a linear expansion coefficient of the adhesive material 3 after thermosetting is aa, a linear expansion coefficient of the insulating material 5 is ab, and a linear expansion coefficient of the core material 6 in the case where the substrate is a multilayer substrate having a core layer is ac, a material system in the first embodiment of the present invention satisfies the relationship represented by the following rational expression (2) at normal temperature or the thermal contact bonding temperature of the adhesive material 3:

at least $aa>ab>ac$, preferably $(ac<)\frac{1}{3}aa<ab<aa<3ab$     (2).

with the provided that the elastic modulus in the above-described rational expression (1) is based on a storage elastic modulus as measured by the DMA method (viscoelasticity measuring method) of a material to be measured, or an elastic modulus as measured by the indentation test by a nanoindenter, while the linear expansion coefficient in the rational expression (2) is based on a linear expansion coefficient as measured by the TMA method (thermal expansion measuring method) of a material to be measured.

Described specifically, when the thermal contact bonding temperature of the semiconductor chip 1 is 200° C., the core material 6 has an elastic modulus of 15 GPa and a linear expansion coefficient of about 10 ppm (plane direction (XY direction)), the surface layer insulating material 5 has an elastic modulus of 1 GPa and a linear expansion coefficient of about 50 ppm (XY direction), and the adhesive material 3 has an elastic modulus of 0.5 GPa (at least ⅓ of the surface layer insulating material 5), and a linear expansion coefficient of about 100 ppm (not greater than 3 times as much as that of the surface layer insulating material 5), for example.

At normal temperature, the core material 6 has an elastic modulus of 20 GPa and a linear expansion coefficient of about 12 ppm (XY direction), the surface layer insulating material 5 has an elastic modulus of 10 GPa and a linear expansion coefficient of about 20 ppm (XY direction), and the adhesive material 3 has an elastic modulus of 5 GPa (at least ⅓ of the surface-layer insulating material 5), and a linear expansion coefficient of about 40 ppm (not greater than 3 times as much as that of the surface layer insulating material 5), for example.

In the rational expression (1), 3Ea (<Ec) must be satisfied because unless the elastic modulus Ec of the core material 6 is greater than 3Ea, deformation of the core material 6 tends to occur, which leads to deformation of the insulating material layer 5 (build-up layer) upon thermal contact bonding.

The number of the insulating material layers 5 formed on each side of the core material 6 of the packaging substrate 8 is not always limited to one, as illustrated in FIG. 1, but two to four insulating material layers may be formed. The elastic modulus and linear expansion coefficient of the insulating material which are described here are defined by the properties of the insulating material layer rightly below the interconnect pattern 4 to which the metal bump 2 is connected.

The principle of the first embodiment of the present invention having the structure as described above will next be described.

FIG. 5 illustrates the influential mechanism of an elastic modulus of the insulating material constituting the surface layer of the substrate on the bump connection state, when an elastic modulus Ea of the adhesive material 3 (NCF: non conductive film is used as the adhesive material here) is about 5 to 6 GPa at normal temperature and about 0.5 to 0.6 GPa (similar to the elastic modulus of a material widely used at present) at the thermal contact bonding temperature of the adhesive material 3. FIG. 5A illustrates that under a low load, while FIG. 5B illustrates that under a high load.

Supposing that the elastic modulus of the insulating material 5 constituting the surface layer of the substrate is Eb, the diagram on the left side illustrates the state when Ea>Eb, that is, when the elastic modulus of the adhesive material 3 is greater than that of the insulating material 5. A combination with a build-up substrate using an insulating material prepared by the semi-additive process, which combination is widely used now, corresponds to the diagram shown on the left side (different from the present invention).

In the semi-additive process, after the insulating material 5 is laid over the core material 6 of the substrate 8, a Cu interconnect layer 4 is formed over the surface layer by electroless plating. Chemical treatment called "surface roughening" is usually performed in order to keep adhesion between the insulating material 5 and Cu plating 4.

Accordingly, when the insulating material 5 has a large elastic modulus (has a high hardness), surface roughening treatment of it does not proceed smoothly. The elastic modulus of the insulating material 5 widely used in the semi-additive process is as low as about from 2 to 3 GPa at normal temperature, which is smaller than the elastic modulus (from 5 to 6 GPa) of the adhesive material 3 at normal temperature (which will equally apply to the elastic modulus of the adhesive material 3 at thermal contact bonding temperature).

As illustrated in FIG. 5A, in the above-described material system using the adhesive material 3 and insulating material 5 of the substrate, a sufficient contact pressure between bump and pad is not available at a low contact bonding load, leading to an unstable connection state. At an increased contact bonding load, on the other hand, the deformation of the Cu pad portion 4 on the substrate side becomes excessive, increasing the possibility of generating a wiring damage as illustrated in FIG. 5B.

In order to actualize a stable connection state while using the above-described material system, process management such as tuning of a contact bonding load within a proper range is inevitable. It has a great influence on a production cost or yield upon mass production.

The diagram on the right side of FIG. 5 illustrate the combination, different from that of the present invention, with a high rigidity substrate (which is not common as a build-up substrate used when a pitch is narrow) manufactured from a glass-cloth-sheet-containing prepreg widely used now.

This widely used prepreg has an elastic modulus of about 15 to 20 GPa at normal temperature, which is at least 3 times as much as that of the adhesive material 3 (Eb>3Ea). A bump/pad contact pressure can easily be maintained stably irrespective of the contact bonding load. Since the rigidity of the surface layer of the substrate is very high compared with that of the adhesive material around the bump 2, however, excessive plastic deformation of the bump 2 occurs during pressure bonding or temperature cycle test after fabrication. In particular, peeling of the bump from the pad occurs upon heating, which heightens the possibility of disconnection.

In the widely employed prepreg, a deformation amount of the surface of the substrate pad is small so that initial fluctuations in the height among the pads or initial fluctuations in the height among the bumps 2 cannot be absorbed readily in particular when a pressure bonding load is small. This disturbs the formation of a uniformly stable connection state.

The diagram on the center of FIGS. 5A and 5B are a bump connection state when the material system according to the present invention is employed. In this case, bonding is performed using the material system satisfying the relationship: Ea<Eb<3Ea, contrary to Ea>Eb which is the usual relationship of an elastic modulus.

In the case of the present invention, the rigidity of the surface layer 5 of the substrate is greater than that of the adhesive material 3 around the bump 2 so that a bump/pad contact pressure can be maintained stably even at a small contact bonding load.

Even if the contact bonding load is high, on the other hand, an excessive plastic deformation of the bump 2 can be suppressed owing to the proper-level deformation of the pad surface of the substrate and in addition, a stable bonding state can be maintained owing to a proper elastic reaction force kept within a range not causing a wiring damage.

In the present invention, therefore, a stable connection state can be attained without being influenced by the level of the contact bonding load or fluctuations thereof upon mass production so that a high yield can be achieved at a low cost.

Figure 6C:
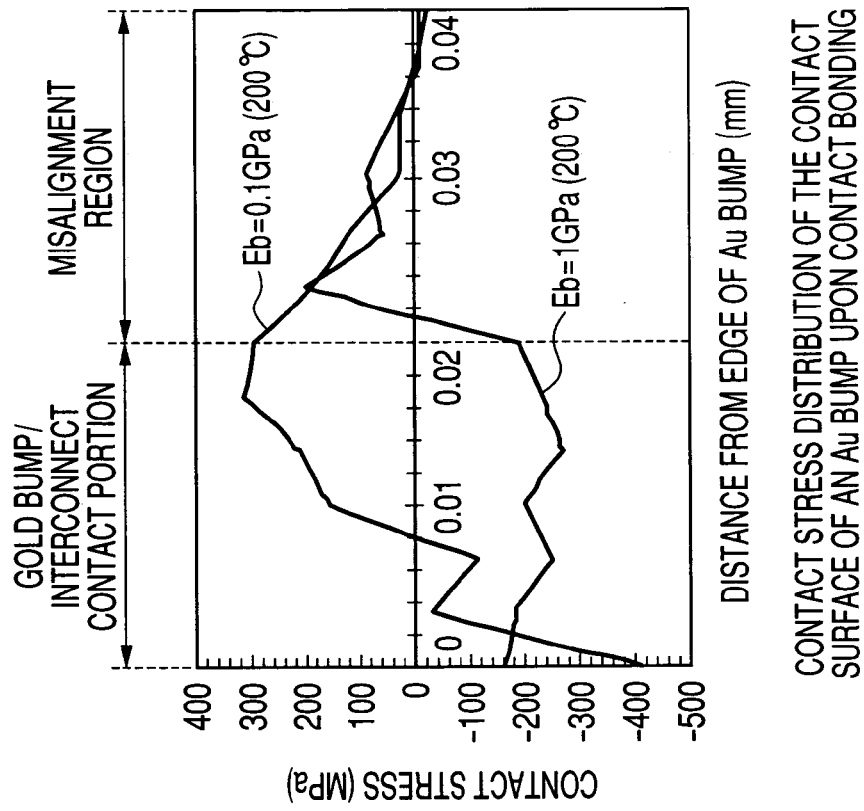
FIGS. 6A to 6C illustrate a contact pressure state between a bump and a pad when misalignment occurs between the bump and the pad upon contact bonding.
Figure 6A:
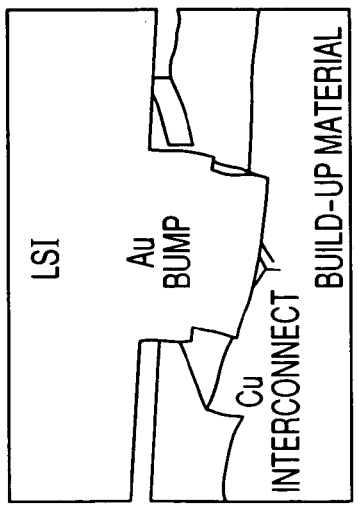
Figure 6B:
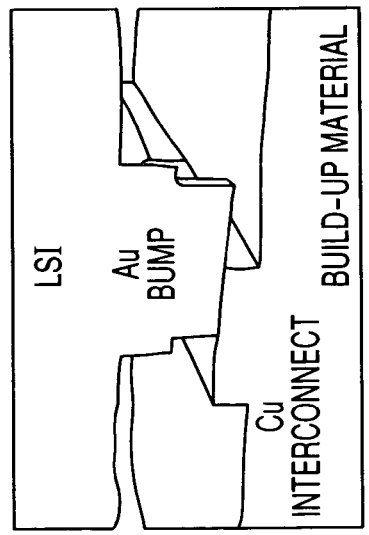

FIGS. 6A to 6C illustrate the bump/pad contact pressure state calculated by the structural analysis in accordance with the finite element method on the assumption that misalignment has occurred between the bump and pad upon contact bonding.

FIG. 6A illustrates the analysis results when the elastic modulus of the insulating material 5 on the surface layer of the substrate is small (Eb=0.1 GPa/200° C.) compared with the elastic modulus (Ea=0.5 to 0.6 GPa/200° C.) of the adhesive material 3 as defined above. FIG. 6B illustrates the analysis results corresponding to the material system of the present invention, that is, when the elastic modulus of the insulating material 5 is greater (Eb=1 GPa/200° C.).

FIG. 6C illustrates the comparison in the relationship of misalignment and contact pressure between the insulating material 5 having an elastic modulus Eb=0.1 GPa/200° C. and that having an elastic modulus of Eb=1 GPa/200° C.

The flip chip connection technology is required to correspond to pitch connection as narrow as 50 mm or less in future. In consideration of inevitable misalignment upon mass production of a semiconductor device, it is essential to actualize a connection structure capable of permitting some misalignment between bump and pad.

However, in a combination with a build-up substrate (Ea>Eb) which is widely used now, as the graph suggests, the surface layer 5 of the substrate has low rigidity so that almost no contact pressure is available (the contact pressure exists only at the bump edge portion) even in an area where the bump and pad overlap each other by tilting the pad surface on the substrate side owing to the misalignment of the bump 2.

In the material system (Eb=1 GPa/200° C.) of the present invention satisfying the relationship of Ea<Eb (and <3Ea), the graph suggests that a sufficient contact pressure is available stably in an area where the bump and pad overlap each other even if a misalignment of the bump occurs.

As described above, the material system of the present invention makes it possible to actualize a stable connection state even against a large misalignment (as large as about half of the diameter of the bump) of the bump 2 which is expected to occur in the narrow-pitch connection.

Figure 7:
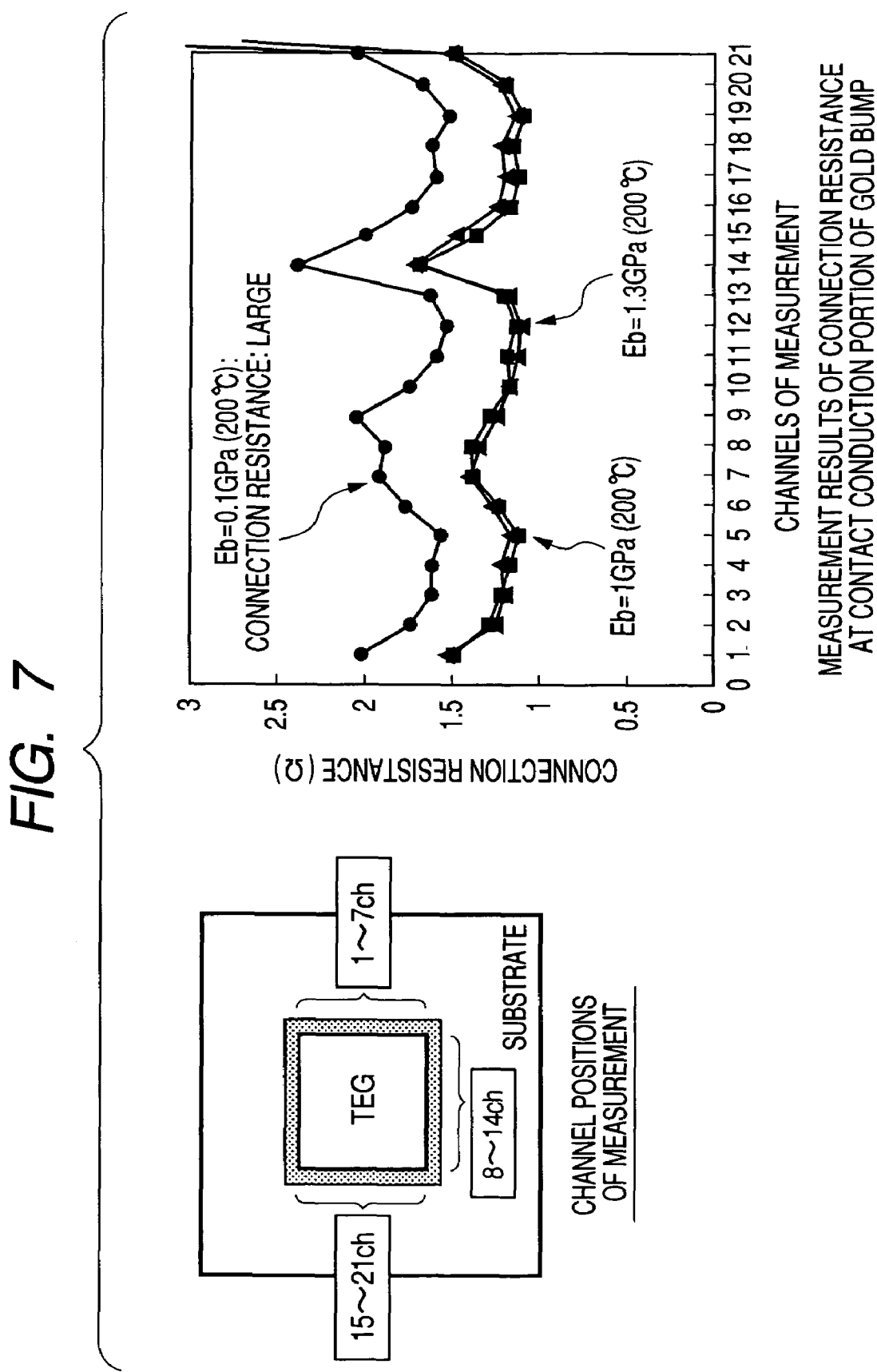
FIG. 7 is a graph illustrating the measurement results of initial connection resistance of each bump area.

FIG. 7 is a graph illustrating the measurement results of initial (contact) connection resistance in every bump area (1 to 21 channels) by using a TEG sample actually made by way of trial. In this TEG sample, the daisy pattern is employed between the chip and substrate via a bump connection portion. This sample is made by way of trial in such a manner that a misalignment about half of the diameter of the bump, which however differs depending on the position of the bump, is intentionally introduced in order to confirm the influence of the misalignment of the bump.

In FIG. 7, a combination (Ea>Eb=0.1 GPa/200° C.) with a build-up substrate which is widely used now has a high initial connection resistance, which is presumed to owe to a difference in the contact resistance at the contact conduction portion, because the wiring length in each measured position is equivalent.

The graph in FIG. 7 means the measurement results showing the actually examined influential mechanism upon misalignment of the bump as illustrated in FIGS. 6A to 6C.

In FIG. 7, although misalignment of the bump 2 has been introduced in each of two TEG samples (Ea<Eb=1 GPa/200° C., 1.3 GPa/200° C.<3Ea) made by way of trial with a material constitution (combination of the adhesive material 3 and insulating material 5 of the substrate) satisfying the material system relationship of the present invention, they show an equal level of connection resistance, revealing that the connection state reaches a stable level.

It is to be noted that in FIG. 7, a difference in the connection resistance among the measured areas does not owe to the variations in the contact resistance at the bump connection portion, but owe to a difference in the wiring length among measured areas.

Figure 8A:
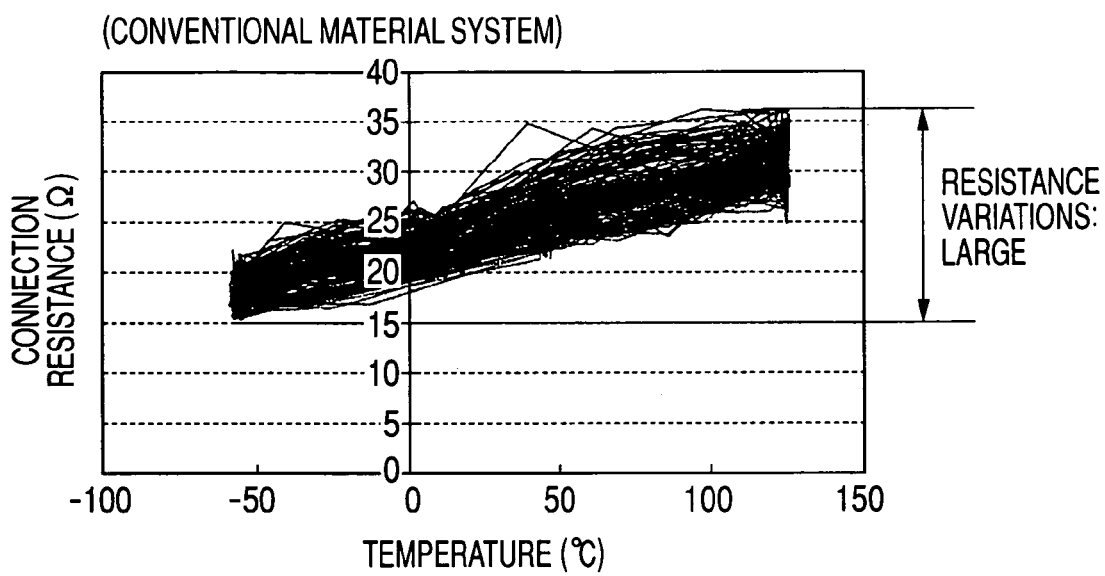
FIGS. 8A and 8B illustrate a change in the connection resistance of the whole bump connection portion in a temperature cycle test.
Figure 8B:
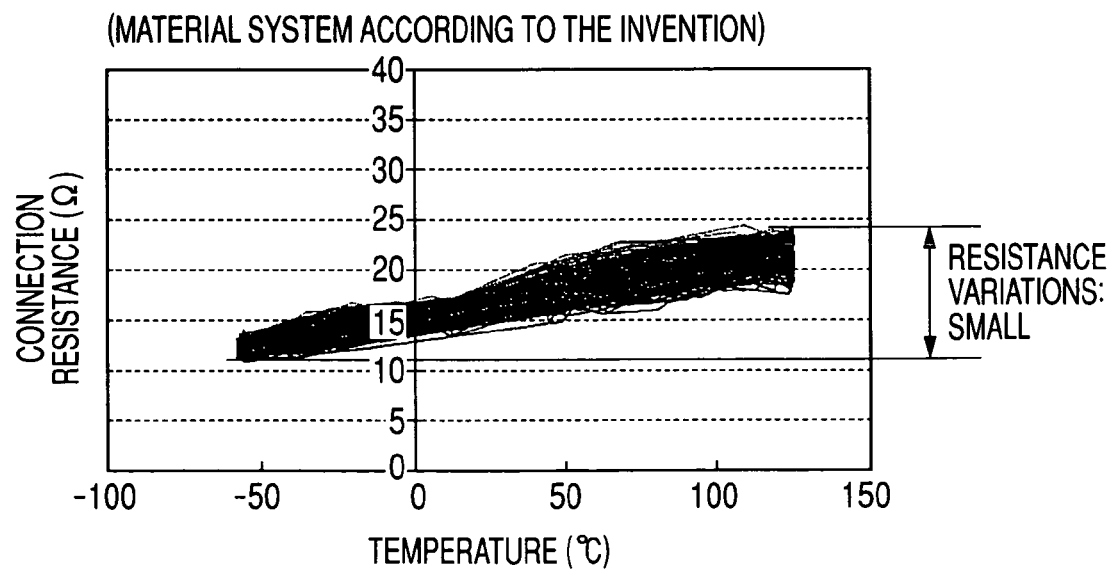

FIGS. 8A and 8B illustrate the monitoring results of a change in the connection resistance of the whole bump connection portion when the TEG sample is subjected to a temperature cycle test. FIG. 8A is of the conventional material system, while FIG. 8B is of the material system of the present invention.

As illustrated in FIGS. 8A and 8B, in the TEG sample satisfying the relationship of the material system according to the present invention, not only the initial connection resistance is low but also variations in the connection resistance upon temperature cycle test are small compared with those of the conventional material system. This means that in this TEG sample, stable connection has been attained within a wide temperature range.

In addition, in the material system according to the present invention, the electrical temperature cycle lifetime exceeds 1000 cycles at −55/125° C.

Figure 9:
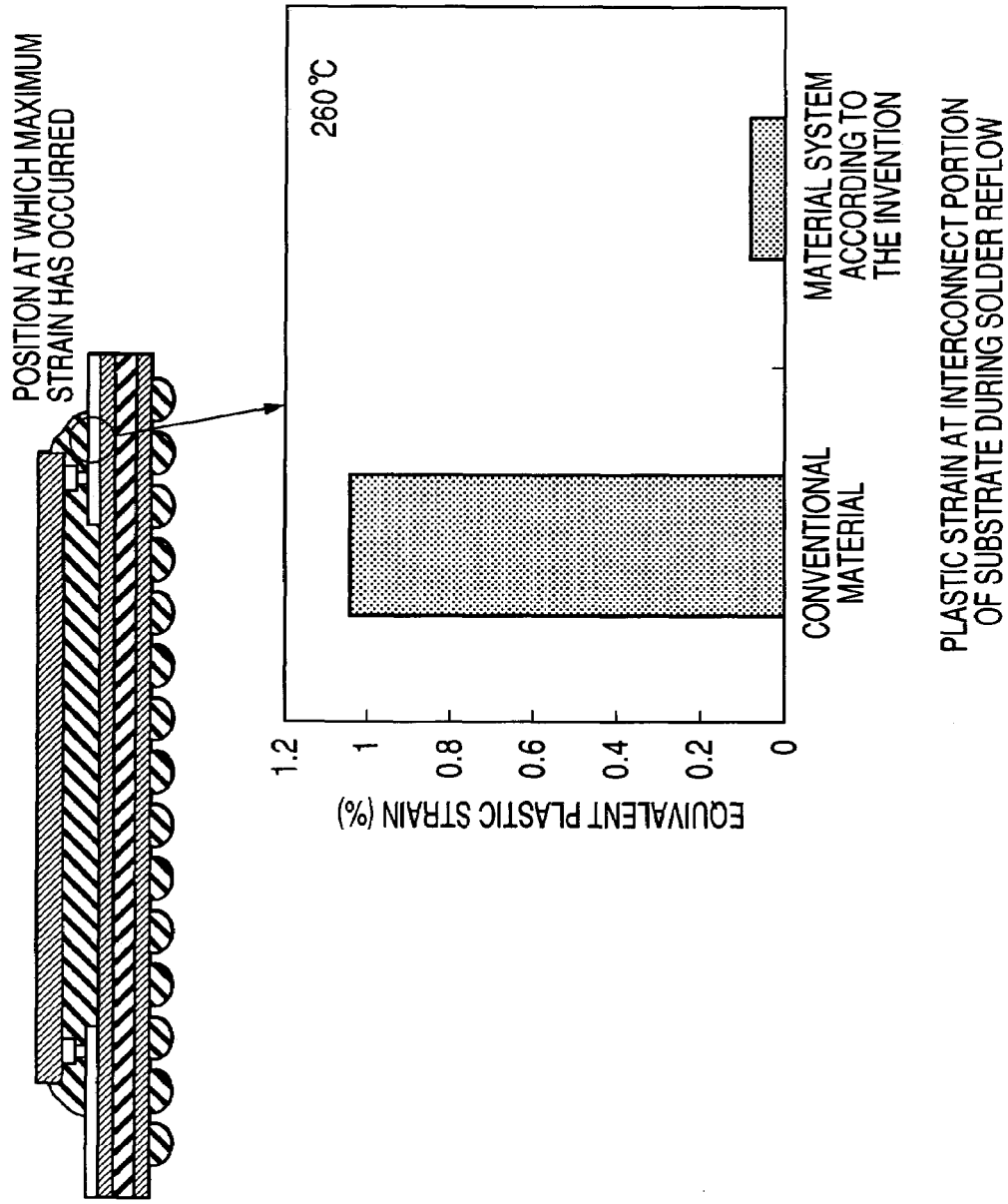
FIG. 9 is a graph showing the calculation results, by the structural analysis in accordance with the finite element method, of an equivalent plastic strain generated at an extraction interconnect portion.

FIG. 9 is a graph showing the results of an equivalent plastic strain (evaluation index of metal fatigue and fracture) calculated by the structural analysis in accordance with the finite element method, said equivalent plastic strain appearing at the extraction interconnect portion when, in a substrate structure in which a land interconnect for a connection pad on the substrate 8 side is lead as is in the peripheral direction, the semiconductor chip 1 having a bump 2 formed thereon is connected by flip chip bonding.

The analysis result shown in FIG. 9 is a strain which has appeared when the substrate is heated up to 260° C. on the assumption of lead-free solder flow conditions. In addition, FIG. 9 shows analysis result of the plastic strain when combination (Ea>Eb=0.1 GPa/200° C.) with a build-up substrate which is widely used now is adopted and also that when the material constitution satisfies the relationship of the material system according to the present invention (Ea<Eb=1 GPa/200° C. and (<3Ea)).

As shown in FIG. 9, the equivalent plastic strain which has occurred in the substrate interconnect upon solder flow heating is very large (exceeding 1%) when the widely used combination (Ea>Eb=0.1 GPa/200° C.) with a build-up substrate is employed. This strain is expected to show a further increase by an increase in the heating temperature as lead-free tendency advances at a much faster pace, or by the finer pattern formation of interconnects.

When the material system (Ea<Eb=1 GPa/200° C. and (<3Ea)) according to the present invention is adopted, on the other hand, the strain occurring under the same heating condition is 0.1% or less, suggesting that the burden on the fine interconnect patterns is very small.

It can be understood that in spite of an increase in the reflow heating temperature or tendency to form finer interconnects in future, a module structure capable of keeping a high reliability can be actualized by the present invention.

As described above, by the first embodiment of the present invention, a semiconductor device improved in the connection reliability between the bump electrode 2 and substrate electrode 4 can be obtained, because the elastic modulus Ea of the adhesive material 3 after thermosetting, the elastic modulus Eb of the insulating material 5 after thermosetting and the elastic modulus Ec of the core material 6 have a relationship satisfying the following equation: ⅓Eb<Ea<Eb<3Ea.

A multilayer substrate 8 can be manufactured and sold separately from an LSI chip and then, it can be connected with an LSI chip which is a semiconductor element. If this multilayer substrate 8 is composed of an adhesive material 3, an insulating material 5, an interconnect pattern 4 and a core material 6, and the relationship among the elastic modulus Ea of the adhesive material 3 after thermosetting, the elastic modulus Eb of the insulating material 5 after thermosetting and the elastic modulus Ec of the core material 6 is caused to satisfy the following rational expression: ⅓Eb<Ea<Eb<3Ea (<Ec), it is a multilayer substrate which can constitute a semiconductor device improved in the connection reliability between the bump electrode 2 and substrate electrode 4.

Figure 2:
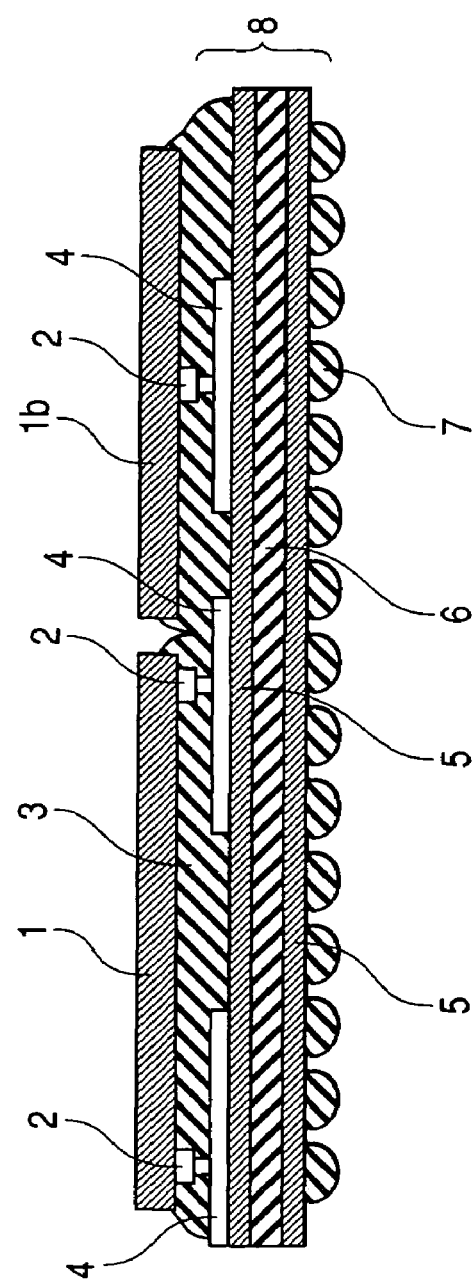
FIG. 2 is a schematic cross-sectional view of a semiconductor device according to the second embodiment of the present invention.

FIG. 2 is a schematic cross-sectional view of a semiconductor device according to the second embodiment of the present invention. The basic structure of this second embodiment is similar to that of the above-described first embodiment except that a plurality of LSI chips 1 and 1b are mounted on one packaging substrate 8 having the same material system as that of the first embodiment.

Specific examples of the combination of these LSI chips 1 and 1b include loading of a microprocessor (microcomputer) and a memory (DRAM) in combination, and loading of these two chips with a flash memory in combination. When a combination of an RF chip and microcomputer is loaded, it can be formed as one module including passive parts, which are mounted simultaneously at the periphery of these chips. When an element with a high calorific value such as graphic engine is mounted together with a memory (DRAM), it is possible to reduce thermal resistance by attaching a radiator plate made of copper or aluminum on the upper surface of the chip.

By this second embodiment, similar effects to those of the first embodiment are available.

Figure 3:
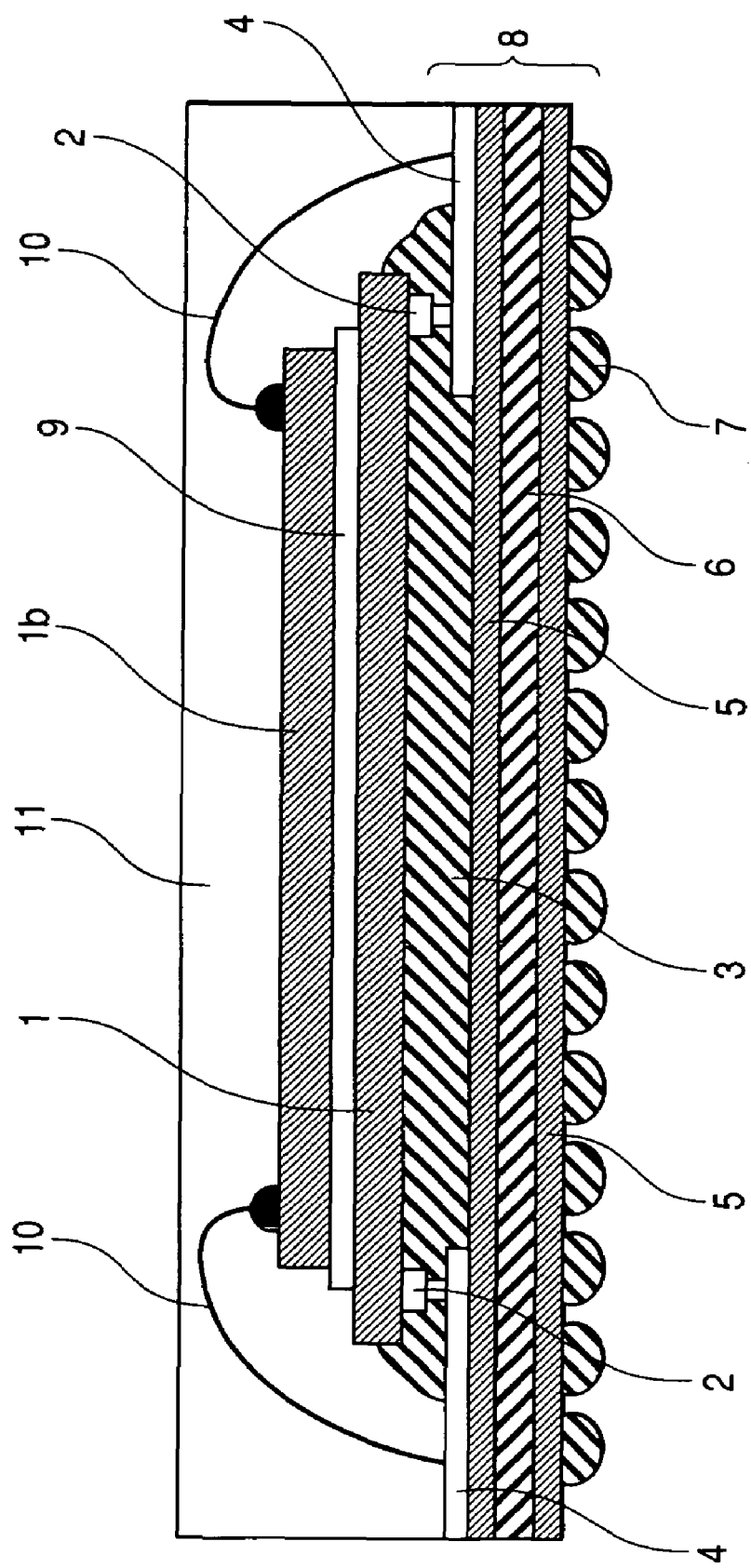
FIG. 3 is a schematic cross-sectional view of a semiconductor device according to the third embodiment of the present invention.

FIG. 3 is a schematic cross-sectional view of a semiconductor device according to the third embodiment of the present invention.

In this third embodiment, a plurality of semiconductor chips 1 and 1b are stacked three-dimensionally. Described specifically, in this third embodiment, the semiconductor chip 1 of the lower layer is mounted on the substrate 8 having a similar material system to that of the first embodiment. The semiconductor chip 1b of the upper layer is fixed to the upper surface of the semiconductor chip 1 of the lower layer with an adhesive material 9.

The semiconductor chip 1 of the lower layer is connected by flip chip bonding so that the chip 1b of the upper layer can be mounted, whether it has a larger area or smaller area, on the semiconductor chip 1 of the lower layer. The chip 1b of the upper layer is electrically connected to the electrode portion 4 formed over the packaging substrate 8 by wire bonding 10.

The whole chip-mounted area is transfer molded and sealed with a resin 11 in order to protect the circuit surface of the chip 1b of the upper layer.

In this third embodiment, it is needless to say that the semiconductor chip 1 of the lower layer is able to receive similar effects to those of the first embodiment. In the wire bonding connection of the semiconductor chip 1b of the upper layer, stable connection can be actualized owing to the similar effects to those of the first embodiment.

Maintenance of a stable contact condition upon bonding is a prerequisite for forming a metal bonding upon wire bonding by ultrasonic vibration.

It is obvious that similar effects are available by constituting the material system satisfying the rational expression (1) as shown in the first embodiment not only in the connection form brought by the contact conduction by the contact pressure of a metal bump but also in the connection form brought by the metal-metal bonding of a metal bump by ultrasonic vibration.

In the third embodiment as illustrated in the diagram, two semiconductor chips 1 and 1b are stacked one after another. It is also possible to stack the third chip and fourth chip over the chip 1b and electrically connect them to the electrode portion 4 formed over the packaging substrate 8 by wire bonding 10.

FIG. 4 illustrates the manufacturing process of a semiconductor device according to the present invention and also that of a semiconductor device according to the conventional process.

In FIG. 4, in the conventional process, a metal bump is formed over the electrode of a semiconductor chip and a wafer is diced into chips with the bump. At the chip mounting position on the substrate, an adhesive sheet is bonded or an adhesive paste is applied. After the bump position of an electrode on the chip and the position of the interconnect pattern on the substrate are aligned, they are temporarily contact-bonded. Then, main contact bonding is performed while heating the resulting substrate to the thermosetting temperature of the adhesive material, whereby a connection step is completed.

In the conventional manufacturing process, a step of bonding the adhesive sheet or a step of applying the adhesive paste is determined individually in consideration of a chip size to be mounted or connection pitch. The TAT (turn-around time) may therefore be longer upon multi-kind small-lot production of custom products.

There is a possibility of the TAT becoming further longer when a plurality of semiconductor chips different in size are mounted on a substrate simultaneously.

In the manufacturing process 1 of the present invention, on the other hand, an adhesive sheet is bonded to a wafer prior to dicing and the wafer is then diced while it has the adhesive sheet bonded thereto, whereby chips each having the NCF bonded thereto are formed. Temporary contact bonding at normal temperature is followed by main contact bonding.

The above-described process does not need a step of bonding the adhesive sheet to the chip mounting position of the substrate in advance and the connecting step can be completed only by the main contact bonding step after alignment.

This manufacturing process 1 is especially effective when a plurality of semiconductor chips 1 and 1b are mounted and connected simultaneously, as in the second embodiment.

In a manufacturing process 2, a wafer is diced into chips by wafer dicing similar to the conventional process. After that, the semiconductor chip and a multilayer substrate manufactured separately are contact-bonded temporarily at normal temperature, followed by main contact bonding. In this process different from the conventional process, NCF is not bonded to the substrate.

In the multilayer substrate prepared separately, the elastic moduli Ea, Eb and Ec of the adhesive material 3, insulating material 5 and core material 6 satisfy the following relationship: $\frac{1}{3}Eb<Ea<Eb<3Ea(<Ec)$, as in the above-described embodiment.

The manufacturing process 2 adopts a material system comprising the multilayer plate 8 and adhesive material 3 so that a semiconductor device is shipped by a substrate maker, for example, in the product form wherein the adhesive material (NCF in the diagram) has been temporarily contact-bonded onto the surface of a multilayer substrate on which a semiconductor element manufactured in advance is to be mounted.

This makes it possible for a semiconductor maker to complete the fabrication of the semiconductor device only by thermal contact bonding of the semiconductor element and therefore, to actualize shortening of the manufacturing process and cost reduction.

The substrate maker can add a new value to a substrate by selling it as a multilayer substrate system in which a substrate and an adhesive material are used in combination. For both the substrate maker and semiconductor maker, adoption of such a manufacturing process is therefore effective.

In recent days, a system*in*package technology capable of actualizing performance improvement to an equal level with that of system LSI and module size reduction while mounting a plurality of existing LSIs with high density has attracted attentions.

The flip chip bonding technology according to the present invention holds an important position for accelerating the development of the above-described system•in•package technology.

The present invention is therefore a key technology for actualizing performance improvement and drastic size reduction of digital cameras and cellular phones and is thought to have an industrially high value.

In the above-described example, the elastic modulus Ea of the adhesive material 3 after thermosetting and the elastic modulus Ec of the core material 6 must satisfy the relationship: $3Ea<Ec$. This relationship is set in order to avoid the easy deformation of the insulating material layer 5 upon thermal contact bonding and is therefore not always necessary for bringing about the effects of the present invention.

The thermal contact bonding temperature of the semiconductor element of the present invention can be adjusted to fall within a range of from 160° C. to 200° C.

The adhesive material 3 and insulating material layers 5 and 6 may contain a filler.

The adhesive material may contain conductive particles further.

What is claimed is:

1. A semiconductor device comprising a semiconductor element having a metal bump electrode formed thereover; a multilayer substrate having an interconnect layer to be placed at a position corresponding to the disposal position of the bump electrode of the semiconductor element and a plurality of insulating material layers; and a thermosetting adhesive material sandwiched between the semiconductor element and the multilayer substrate for connecting the multilayer substrate with the semiconductor element while bringing the interconnect layer of the multilayer substrate into contact with the metal bump, wherein:

an elastic modulus of the thermosetting adhesive material after thermosetting is Ea, an elastic modulus of the insulating material layer on the semiconductor element side of the multilayer substrate after thermosetting is Eb, and the relationship between Ea and Eb, at the same temperature as one another, satisfies the following rational expression at a thermal contact bonding temperature of the metal bump and the interconnect layer: $\frac{1}{3}Eb<Ea<Eb<3Ea$.

2. The semiconductor device according to claim 1, wherein an elastic modulus of a core material layer opposite to the semiconductor element via the insulating material layer on the side of the semiconductor element is Ec, and the relationship between Ea and Ec satisfies the following rational expression at a thermal contact bonding temperature of the metal bump electrode and the interconnect layer: $3Ea<Ec$.

3. A semiconductor device comprising a semiconductor element having a metal bump electrode formed thereover; a multilayer substrate having an interconnect layer to be placed at a position corresponding to the disposal position of the bump electrode of the semiconductor element and a plurality of insulating material layers; and a thermosetting adhesive material sandwiched between the semiconductor element and the multilayer substrate for connecting the multilayer substrate with the semiconductor element while bringing the interconnect layer of the multilayer substrate into contact with the metal bump, wherein:

a linear expansion coefficient of the thermosetting adhesive material after thermosetting is aa, a linear expansion coefficient of the insulating material layer on the semiconductor element side of the multilayer substrate after thermosetting is ab, and the relationship between aa and ab, at the same temperature as one another, satisfies the following rational expression at a thermal contact bonding temperature of the metal bump and the interconnect layer: $\frac{1}{3}aa<ab<3ab$.

4. The semiconductor device according to claim 3, wherein a linear expansion coefficient of a core material layer opposite to the semiconductor element via the insulating material layer on the semiconductor element side is ac, and the relationship between ac and aa satisfies the following rational expression at normal temperature or at a thermal contact bonding temperature of the metal bump electrode and the interconnect layer: $ac<\frac{1}{3}aa$.

5. A semiconductor device comprising a semiconductor element having a metal bump electrode formed thereover; a multilayer substrate having an interconnect layer to be placed at a position corresponding to the disposal position of the bump electrode of the semiconductor element and a plurality of insulating material layers; and a thermosetting adhesive material sandwiched between the semiconductor element and the multilayer substrate for connecting the multilayer substrate with the semiconductor element while bringing the interconnect layer of the multilayer substrate into contact with the metal bump, wherein:

an elastic modulus of the thermosetting adhesive material after thermosetting is Ea, an elastic modulus of the insulating material layer on the semiconductor element side of the multilayer substrate after thermosetting is Eb, an elastic modulus of the core material layer opposite to the semiconductor element via the insulating material layer on the side of the semiconductor element is Ec, and the relationship among Ea, Eb and Ec at the same temperature as one another, satisfies the following rational expression at a thermal contact bonding temperature of the metal bump and the interconnect layer: $Ea<Eb<Ec$.

6. A semiconductor device comprising a semiconductor element having a metal bump electrode formed thereover; a multilayer substrate having an interconnect layer to be placed at a position corresponding to the disposal position of the bump electrode of the semiconductor element and a plurality of insulating material layers; and a thermosetting adhesive material sandwiched between the semiconductor element and the multilayer substrate for connecting the multilayer substrate with the semiconductor element while bringing the interconnect layer of the multilayer substrate into contact with the metal bump, wherein:

a linear expansion coefficient of the thermosetting adhesive material after thermosetting is aa, a linear expansion coefficient of the insulating material layer on the semiconductor element side of the multilayer substrate after thermosetting is ab, a linear expansion coefficient of the core material layer opposite to the semiconductor element via the insulating material layer on the semiconductor element side is ac, and the relationship among aa, ab and ac satisfies the following rational expression at a thermal contact bonding temperature of the metal bump electrode and the interconnect layer: $ac<ab<aa$.

7. The semiconductor device according to claim 2, wherein the elastic moduli Ea, Eb and Ec are each based on a storage elastic modulus as measured by the viscoelasticity measuring method or a surface layer elastic modulus determined by the indentation test using a nanoindenter.

8. The semiconductor device according to claim 4, wherein the linear expansion coefficients aa, ab and ac are each based on a linear expansion coefficient as measured by the thermal expansion measuring method.

9. The semiconductor device according to claims 1, wherein the thermal contact bonding temperature of the semiconductor element falls within a range of from 160.degree. C. to 200.degree. C.

10. The semiconductor device according to claims 1, wherein the adhesive material and insulating material layer each contains a filler.

11. The semiconductor device according to claims 1, wherein the adhesive material contains conductive particles.

12. A multilayer substrate for a semiconductor device, which comprises an interconnect layer disposed at a position corresponding to the position of a bump electrode of a semiconductor element, a plurality of insulating material layers, and a thermosetting adhesive material placed over the insulating material layer disposed on the semiconductor element side in order to connect the multilayer substrate with the semiconductor element while bringing the interconnect layer into contact with the metal bump of the semiconductor element, wherein:

an elastic modulus of the thermosetting adhesive material after thermosetting is Ea, an elastic modulus of the insulating material layer on the semiconductor element side is Eb, and the relationship between Ea and Eb, at the same temperature as one another, satisfies the following rational expression at a thermal contact bonding temperature of the metal bump and the interconnect layer: $\frac{1}{3}Eb < Ea < Eb < 3Ea$.

13. The multiplayer substrate for the semiconductor device according to claim 12, wherein an elastic modulus of the core material layer opposite to the semiconductor element via the insulating material layer on the semiconductor element side is Ec, and the relationship between Ea and Ec satisfies the following rational expression at a thermal contact bonding temperature of the metal bump electrode and the interconnect layer $3Ea < 3Ec$.

* * * * *